United States Patent [19]

Banks et al.

[11] 4,433,251

[45] Feb. 21, 1984

[54] POWER SUPPLY CIRCUITRY

[75] Inventors: William D. Banks; Frank G. Bond, both of Shrewsbury; Raymond L. Naylor, Framingham, all of Mass.

[73] Assignee: Dennison Manufacturng Company, Framingham, Mass.

[21] Appl. No.: 304,298

[22] Filed: Sep. 21, 1981

[51] Int. Cl.³ .................... H03K 17/56; H03K 17/60; H03K 3/26

[52] U.S. Cl. ................................ 307/246; 307/252 J; 307/318

[58] Field of Search ............ 307/252 J, 252 N, 252 R, 307/318, 246

[56] References Cited

U.S. PATENT DOCUMENTS

| | | | |
|---|---|---|---|
| 3,764,832 | 10/1973 | Stettner | 307/252 N |
| 3,906,294 | 9/1975 | Lourigan | 307/252 R |
| 4,028,611 | 6/1977 | Tashiro et al. | 307/252 N |
| 4,118,768 | 10/1978 | Wilson, Sr. | 307/252 N |
| 4,168,443 | 9/1979 | Periot | 307/252 R |
| 4,355,343 | 10/1982 | Gross | 307/252 N |

Primary Examiner—John S. Heyman
Assistant Examiner—Timothy P. Callahan
Attorney, Agent, or Firm—Arthur B. Moore

[57] ABSTRACT

A power supply circuit suitable for driving a solenoid or similar electronic device. The circuit provides high pulse current, low duty cycle drive signals over wide output voltage and current ranges. The circuit advantageously employs a silicon controlled rectifier to control the recharging current to an output storage capacitor. The use of an SCR as the controlling device provides high efficiency with precise line regulation.

3 Claims, 10 Drawing Figures

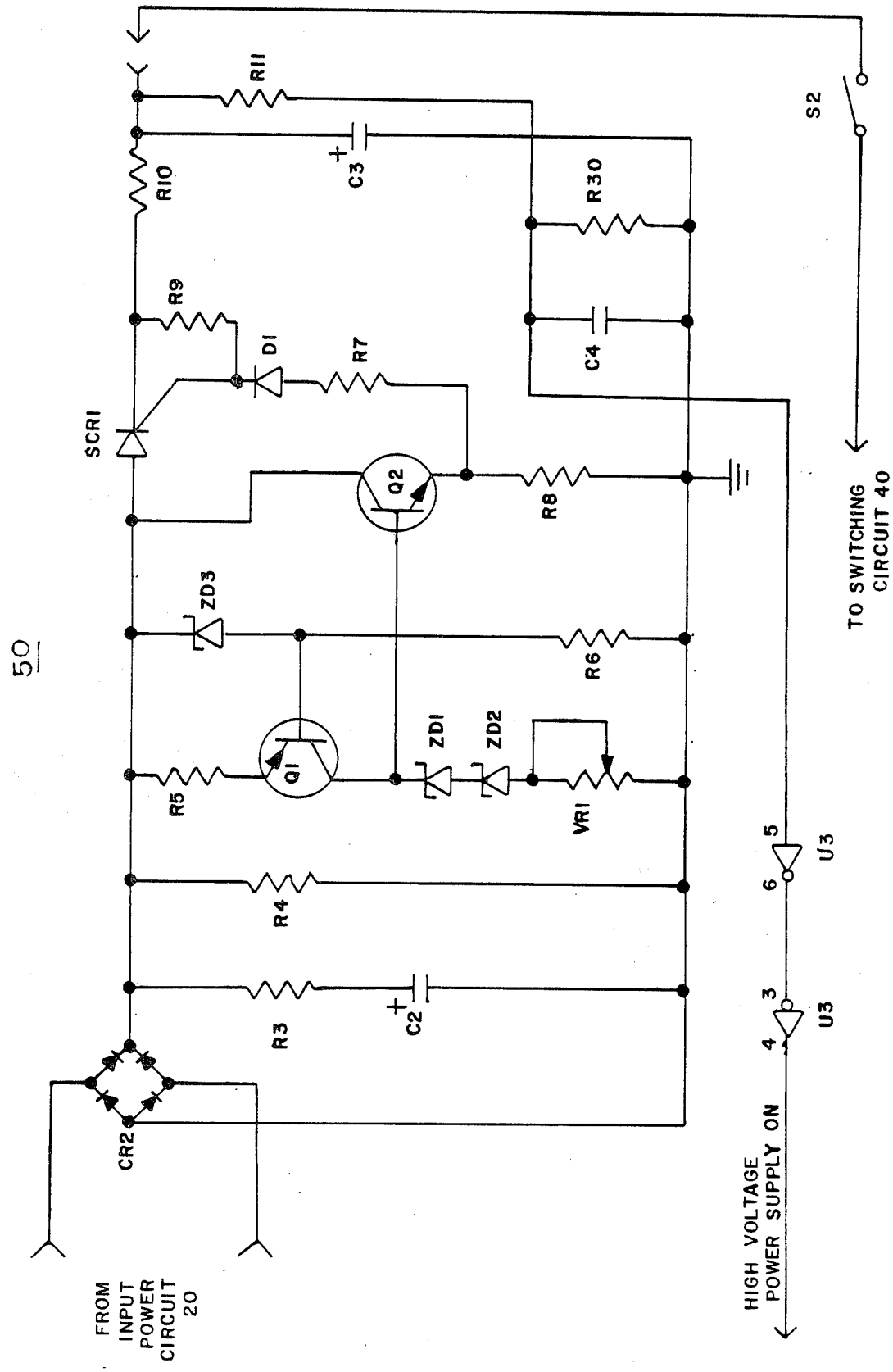

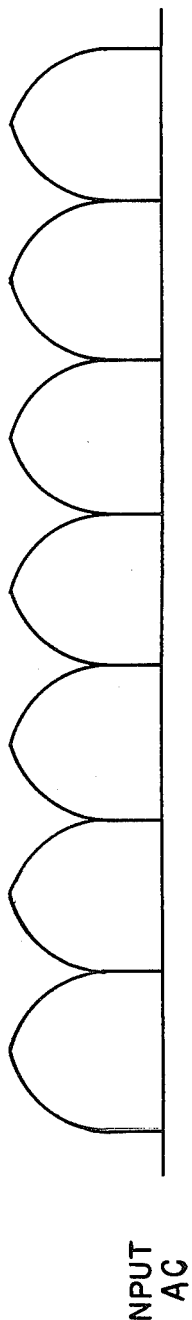
FIG. 5A INPUT AC
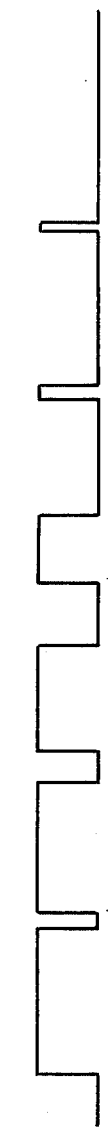
FIG. 5B SCR-1
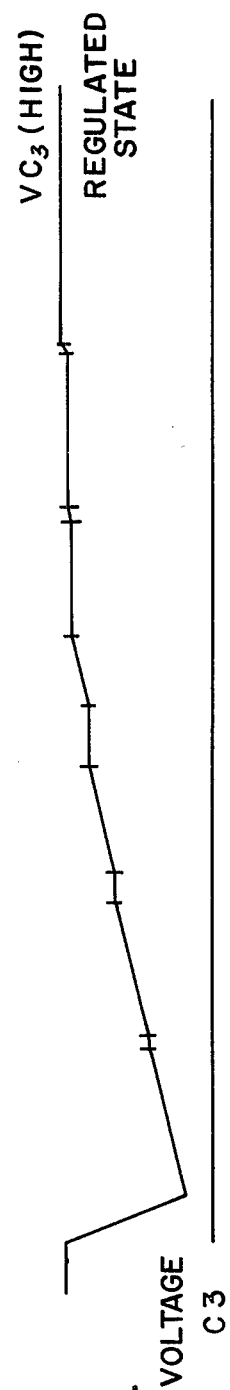
FIG. 5C VOLTAGE C3
VC₃ (HIGH) REGULATED STATE
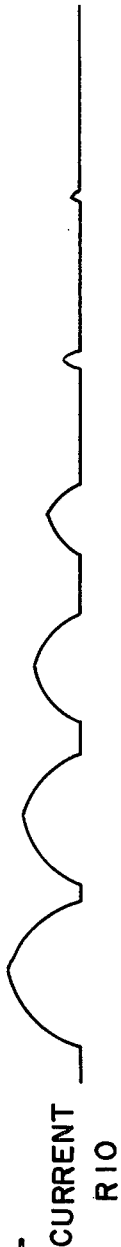
FIG. 5D CURRENT R10

POWER SUPPLY CIRCUITRY

BACKGROUND OF THE INVENTION

The present invention relates to driving circuitry for solenoids and the like, and more particularly to the voltage regulator portion of such circuitry.

A number of criteria must be considered in designing suitable circuitry for driving a solenoid or similar electronic device. The circuit designer must determine the range of output currents, voltages, and other output parameters required by the application in question. In order to minimize internal heating, it is furthermore desirable to utilize a high efficiency design.

A particular application requiring circuitry of this type is disclosed in commonly assigned copending patent application Ser. No. 296,757 which discloses apparatus for severing and stacking tickets incorporating a single solenoid to drive the various moving parts. In the preferred embodiment of this apparatus, the solenoid is operated at low duty cycle with high pulse current input. These particular characteristics in addition to the general criteria above mentioned are not satisfied in the prior art.

The voltage regulation section of such drive circuitry is particularly critical to its operation. This type of circuitry is discussed in *The Voltage Regulation Handbook*, compiled by the Engineering Staff of Texas Instruments, Inc. (1977). This reference discloses a variety of voltage regulator types, including "switching" regulators. None of the regulators disclosed, however, provide reliable high-power outputs with low power dissipation.

Accordingly, it is a primary object of the invention to provide voltage supply circuitry which yields output signals over a wide range of voltages and currents. A related object is that such circuitry be particularly suited to applications demanding low duty cycles and high pulse currents.

Another object of the invention is to achieve circuitry of this type having high efficiency. A related object is the reduction of internal heating.

A further object of the invention is that such circuitry be designed with reference to various economic factors. A related object is the provision of apparatus having relatively few parts and a low cost of manufacture. Yet another related object is the achievement of compact drive circuitry.

Still another object of the invention is the provision of precise line regulation in such circuitry.

SUMMARY OF THE INVENTION

The drive circuit of the invention incorporates a novel regulated DC power supply which is simple and inexpensive. The voltage regulating portion of this circuitry is particularly suited to low duty cycle applications which require precise line regulation. The circuit of the invention provides characteristically high pulse currents with wide voltage range capabilities.

In accordance with one aspect of the invention, the voltage regulating circuitry provides a source current to periodically recharge a supply element to a regulated voltage level. This recharging process occurs during an off portion of each drive circuit duty cycle. During the on portion of each duty cycle, the supply element is discharged to a load. In the preferred embodiment, the load comprises a solenoid.

In the preferred embodiment of the invention, the drive circuit includes a "switching" type voltage regulating section incorporating a silicon controlled rectifier as the controlling switch. Due to its on/off characteristic, this element provides high output currents with extremely low power dissipation.

In accordance with a further aspect of the invention the voltage regulating circuitry includes one or more zener diodes to establish a reference voltage level. This reference voltage regulates SCR operation and determines the charging level of the supply element. In the preferred embodiment, the voltage regulating circuitry also incorporates a current supply to maintain constant current through the zener diodes.

In accordance with yet another aspect of the invention the storage elements comprise an output capacitor and resistor, the values of which determine the recharging time constant of this circuit. The output capacitor may provide an extremely high output pulse current, subject to the requirement of sufficient recharging time, and its current handling limitations.

BRIEF DESCRIPTION OF THE DRAWINGS

The above and additional aspects of the invention are illustrated with reference to the detailed description which follows, taken in conjunction with the drawings in which:

FIG. 4 is a schematic diagram of a voltage regulating circuit in accordance with a preferred embodiment of the invention;

FIG. 5A is a time plot of an illustrative rectified AC waveform;

FIG. 5B is a time plot of the cathode voltage of the silicon controlled rectifier of FIG. 4;

FIG. 5C is a time plot of the voltage across the output capacitor of FIG. 4;

FIG. 5D is a time plot of the silicon controlled rectifier output current for FIG. 4;

DETAILED DESCRIPTION

The power supply circuitry of the invention is particularly suited to the driving of a solenoid or similar electronic device. In an illustrative embodiment of the invention, the power supply circuitry is utilized as control circuitry for the operation of a single solenoid in apparatus for severing and stacking tickets as disclosed in the commonly assigned copending U.S. application Ser. No. 296,757 entitled "Severing And Stacking Apparatus", filed Aug. 27, 1981. The power requirements of such a solenoid impose a number of drive circuit output parameters. It is preferred that the drive signal be suited to low duty cycle applications over a wide range of output voltages. Accordingly, high pulse current signals are particularly suitable for driving such a solenoid. Other characteristics to be considered are the desirability of a high precision of line regulation, preferably better than 2 percent, and a high circuit efficiency to avoid significant internal heating. The power supply circuit illustrated in FIGS. 1–4 achieves these characteristics using relatively few parts, providing a compact, low cost drive package.

Figure 1:
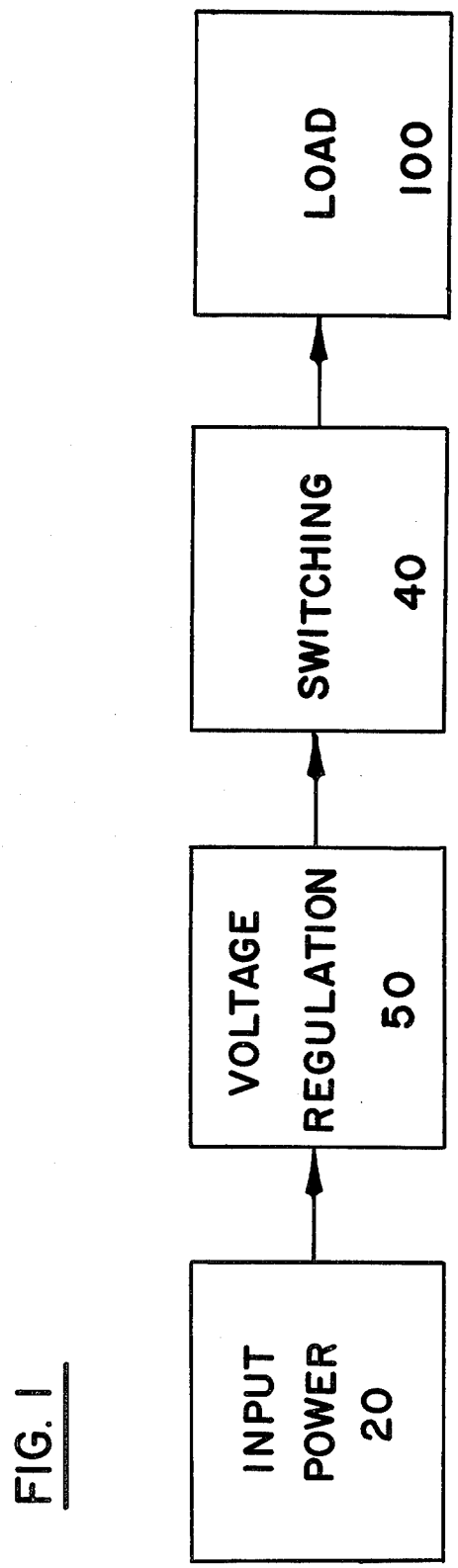
FIG. 1 is a functional block diagram of the drive circuit of the invention.

A functional design for the drive circuit is schematically illustrated in the block diagram of FIG. 1. The drive circuit includes an input drive circuit 20 for providing an AC signal of a predetermined voltage and frequency; a voltage regulating block 50 responsive to this AC signal providing a regulated output DC voltage; and a switching circuit 49 for periodically applying this voltage to a load 100 during an "on" portion of each duty cycle.

Figure 2:
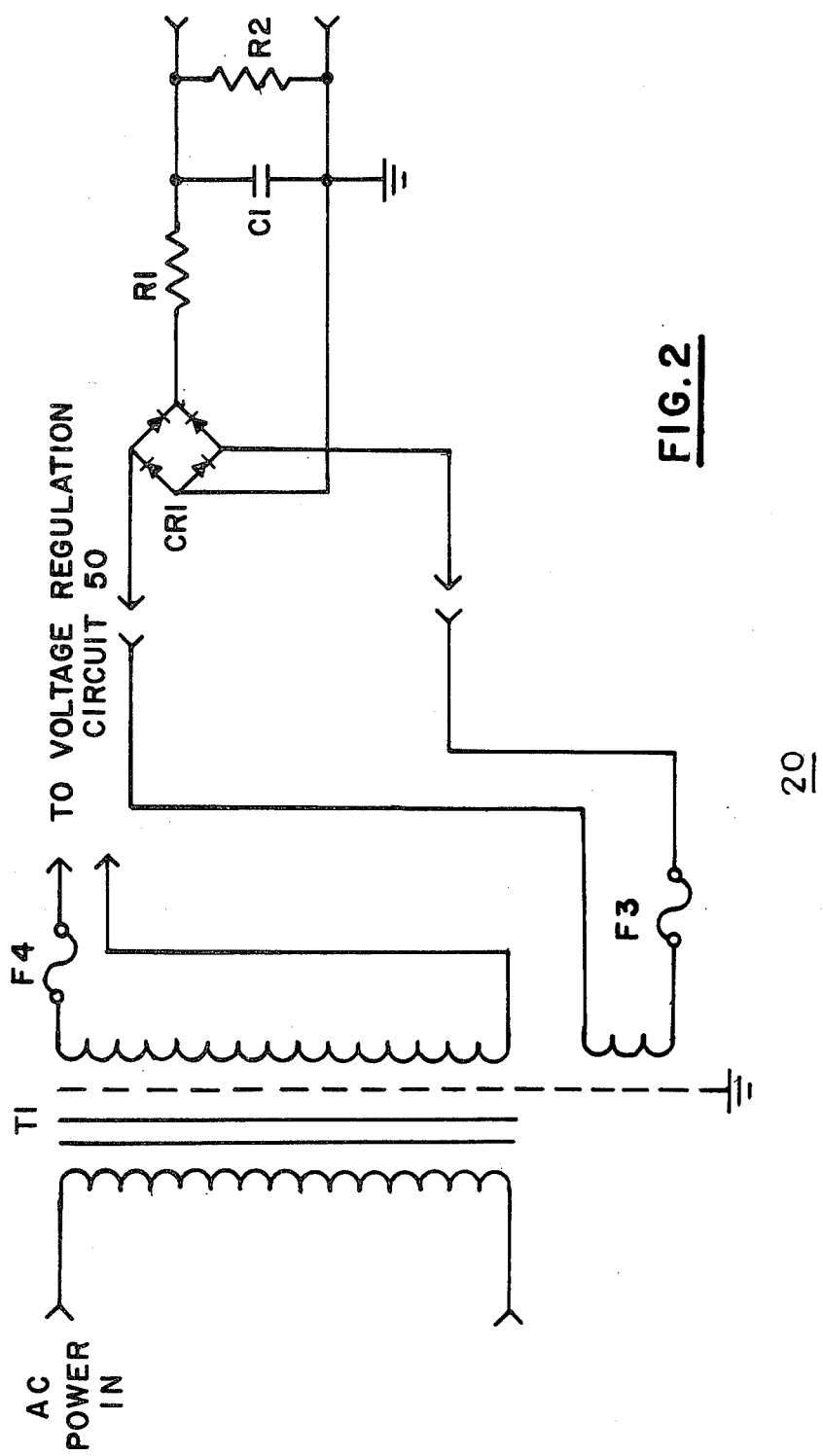
FIG. 2 is a schematic diagram of an illustrative input power circuit for the drive circuit of FIG. 1.

As shown in the schematic view of FIG. 2, the AC power supply 20 passes an input AC voltage through a transformer T1 to convert the input voltage to one on the order of several hundred volts. The amplitude of this converted AC voltage is designed to be greater than the regulated output DC voltage of voltage regulation circuit 50. The AC output voltage of power supply 20 is then processed by voltage regulation circuit 50 as discussed below.

Figure 3:
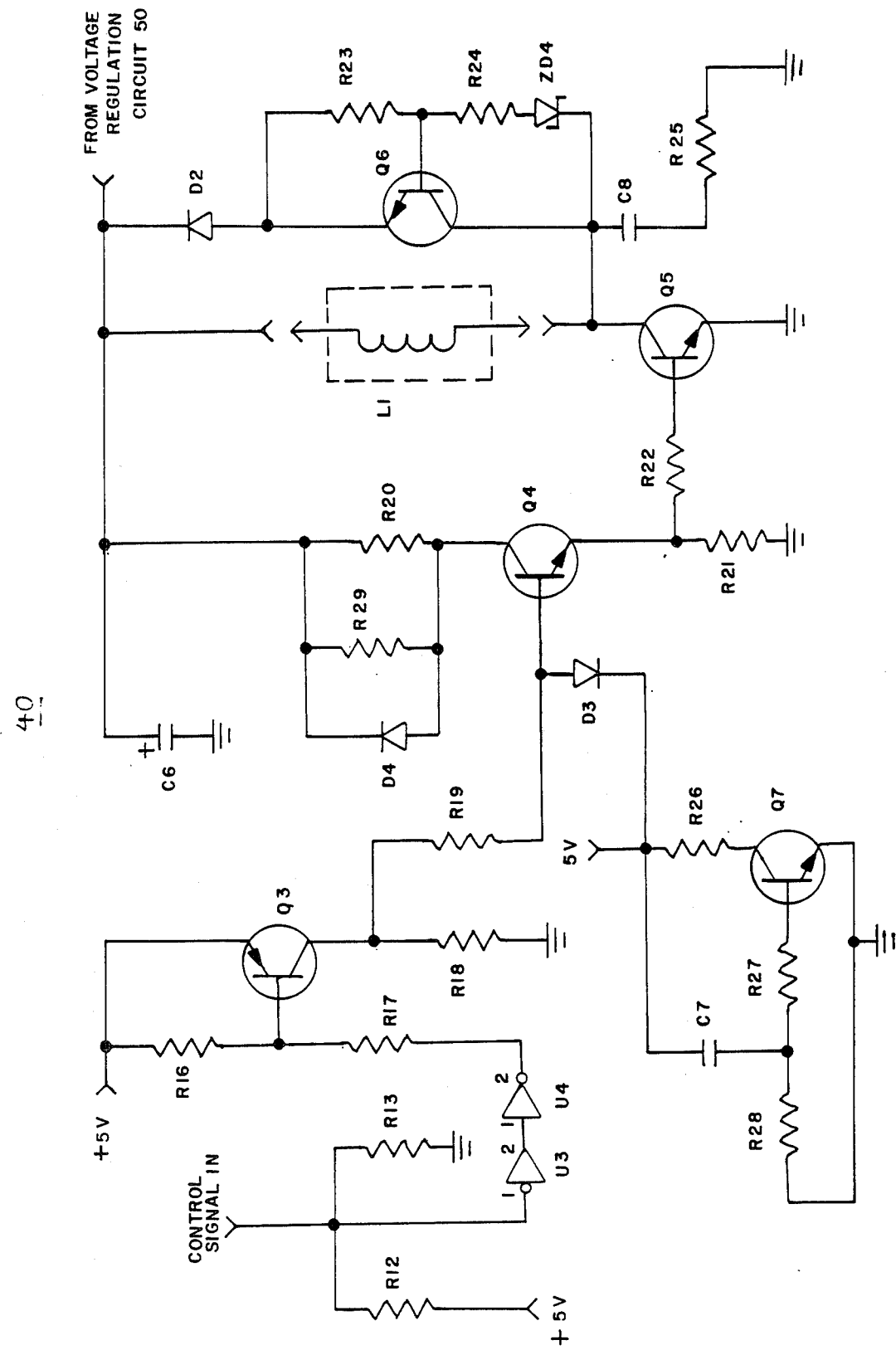
FIG. 3 is a schematic diagram of an illustrative switching circuit for the circuit of FIG. 1.

Switching circuit 40, as shown in FIG. 3, periodically delivers the electrical energy of charged capacitor C3 (FIG. 4) to a solenoid or other load 100, which is modeled as an inductance L1. Transistor Q5 and preceding amplification stages Q4 and Q3 periodically receive an externally generated control signal which establishes the timing of the discharge to load 100. At the end of each "on" cycle, the signal from capacitor C3 is no longer passed by transistor Q5, at which point a current has built up in inductive element L1. This current is diverted to transistor Q6 and related circuit elements R23, R24, ZD4 and R25. The voltage level established by zener diode ZD4, illustratively on the order of 100 volts, is chosen to provide rapid discharge characteristics for this portion of switching block 40.

Transistor Q7 and the related circuit elements divert control signals from transistors Q4 and Q5 during power reset.

Figure 7:
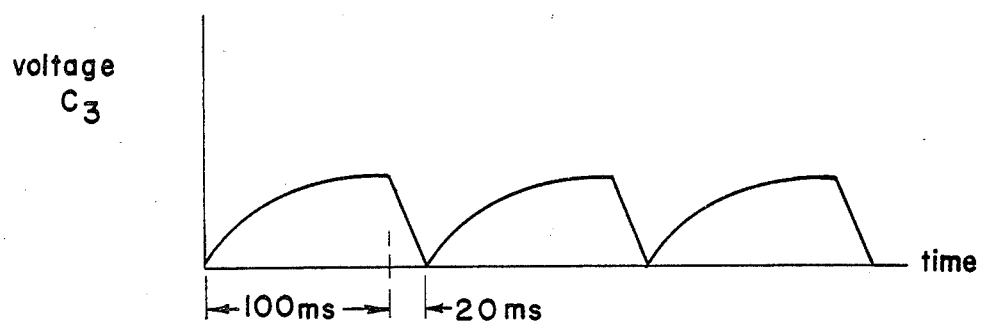
FIG. 7 is the time plot of FIG. 5C, extrapolated over several charging/discharge cycles.

In the illustrated embodiment, the on portion of each duty cycle comprises around 20 milliseconds. The off portion of each duty cycle is determined by the time necessary to recharge capacitor C3, which in turn depends on the extent to which the capacitor is discharged. With reference to the schematic view of FIG. 4, showing the voltage regulator circuit 50, the minimum recharge period may be approximated as somewhat greater than the product 5(R10)(C3). For illustrative circuit values of C3=1200 microfarads, R10=10 ohms, the minimum recharge period is about 60 milliseconds. In actual operation, the preferred duty cycle off period for these circuit values is approximately 100 milliseconds. Therefore, as shown in the voltage plot for capacitor C3 (FIG. 7), the duty cycle ratio for the circuit 10 is given as $$\frac{\text{on time}}{\text{off time}} = \frac{1}{5}.$$

The output load current is limited by the requirement that capacitor C3 have sufficient time to accumulate the needed charge before the load 100 is reapplied. The output current is also limited by the thermal specifications of capacitor C3.

With reference to the schematic view of FIG. 4, the AC output signal from input power block 20 passes through full wave bridge rectifier CR2 which provides an output signal of the type shown by the solid line plot of FIG. 5A. This rectified signal, illustratively of an amplitude of several hundred volts, passes through input filter elements R3, C2, R4, to be processed by the various elements of voltage regulating circuit 50 and periodically recharge capacitor C3 to a desired voltage.

Figure 6:
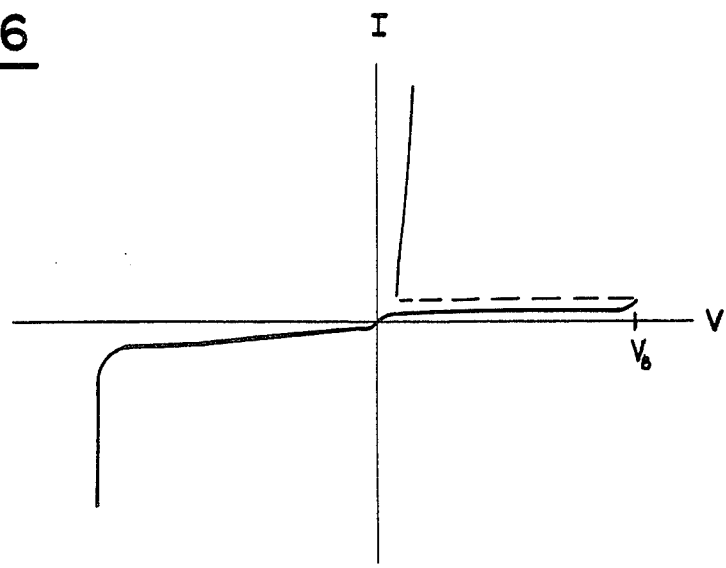
FIG. 6 is an I-V schematic diagram showing illustrative silicon controlled rectifier characteristics as known in the prior art.

In the illustrated, preferred embodiment a silicon controlled rectifier SCR1 acts as a switching element to control the charging of capacitor C3. Typical voltage-current characteristics of such a device are illustrated in FIG. 6. In the first quadrant, with the anode positive, the output current increases slowly (the "off" state) until a breakover voltage $V_B$ is reached, at which point the forward current increases rapidly (the "on" state). When the forward voltage exceeds the breakover value, the voltage across the SCR drops to a very low value, the forward on-state voltage. The SCR will remain in this state until the current drops below the holding current, i.e. when the anode voltage no longer exceeds the cathode voltage.

The breakover voltage of SCR1 may be controlled by varying the current to its gate. At a gate current of zero, the principal voltage must reach voltage $V_B$ for breakover to occur, but the breakover voltage $V_B$ decreases with an increase in gate current until the SCR converts to the on state. This enables the device to control high-power loads with low power dissipation. This characteristic results in an inexpensive, highly efficient regulated DC power supply. The use of the silicon controlled rectifier as the switching element renders voltage regulator block 50 particularly suitable for applications requiring precise line regulation with imprecise load regulation.

The voltage to the gate of SCR1 is established by zener diodes ZD1 and ZD2, with a potentiometer VR1 to allow fine adjustment of the zener voltage. With reference to the time plot of FIG. 5A, SCR1 will provide current to capacitor C3 when the rectified AC voltage to the SCR anode exceeds the breakover voltage $V_B$ (FIG. 6). As illustrated in FIG. 5B, during successive cycles of AC input, SCR1 remains on for progressively smaller portions of each cycle. This is attributable to the voltage buildup at capacitor C3 as plotted in FIG. 5C. This process will continue until the cathode voltage reaches the gate voltage level established by ZD1, ZD2, and VR1, at which point the capacitor C3 reaches its regulated full charge level. FIG. 5D plots the successively smaller charging currents to capacitor C3 through resistor R10.

With further reference to the schematic diagram of of FIG. 4, voltage regulator 50 advantageously includes a transistor Q1 and zener diodes ZD3 which provide a current source to maintain a constant current through zener diodes ZD1 and ZD2, minimizing the effect of zener impedance on the reference voltage, and providing stable operation over varying supply voltages. The transistor Q2 acts as an amplifier for the current to the gate of SCR1. Diode D1 protects the gate of SCR1 during reverse bias conditions.

The collector breakdown voltage of transistors Q1 and Q2 effectively determines the upper limit of the output voltage range of voltage regulating circuit 50. In the illustrated embodiment, the output voltage has an upper limit on the order of 250–300 volts. This voltage limit could be increased with a corresponding increase in circuit cost, subject additionally to the specifications of SCR-1.

While various aspects of the invention have been set forth by the drawings and the specification, it is to be understood that the foregoing detailed description is for illustration only and that various changes in parts, as well as the substitution of equivalent constituents for those shown and described, may be made without departing from the spirit and scope of the invention as set forth in the appended claims.

We claim:

1. Improved drive circuitry of the type including an electrical storage element, means for routing electrical energy from said electrical storage element to a load during "on" periods, and means for recharging said electrical storage element during intervening "off" periods, a time-varying potential, a silicon controlled rectifier for receiving said time-varying potential and delivering a recharging current to said electrical storage element, and a threshold regulating means for establishing a predetermined voltage at the gate of said silicon controlled rectifier, wherein the improvement comprises an improved threshold regulating means for said silicon controlled rectifier comprising a zener diode, and means for providing an essentially constant current through said zener diode.

2. Apparatus as defined in claim 1, wherein the means for providing an essentially constant current comprises a further zener diode, and a transistor.

3. Apparatus as defined in claim 1, further comprising voltage adjustment means for providing precise variation of said predetermined voltage.

* * * * *